United States Patent [19]
Ikeda

[11] Patent Number: 5,940,455
[45] Date of Patent: Aug. 17, 1999

[54] ADAPTIVE FILTER WITH DISABLING CIRCUIT FOR FAST TAP WEIGHT CONVERGENCE

[75] Inventor: Shigeji Ikeda, Tokyo, Japan

[73] Assignee: NEC Corporation, Tokyo, Japan

[21] Appl. No.: 08/807,694

[22] Filed: Feb. 28, 1997

[30] Foreign Application Priority Data

Feb. 28, 1996 [JP] Japan .................................. 8-040224

[51] Int. Cl.[6] .............................. H04B 1/10; H04B 3/20; H04M 1/00
[52] U.S. Cl. .......................... 375/350; 375/346; 379/406; 379/410; 379/411; 370/286; 370/289; 370/290; 370/291
[58] Field of Search .................................. 375/346, 350; 364/724.011, 724.012; 379/399, 402, 406, 410, 411; 370/282, 286, 288, 289, 290, 291

[56] References Cited

U.S. PATENT DOCUMENTS

| | | | |
|---|---|---|---|
| 4,131,767 | 12/1978 | Weinstein | 379/411 |
| 4,468,640 | 8/1984 | Gritton | 333/166 |
| 4,468,641 | 8/1984 | Duttweiler et al. | 333/166 |
| 4,479,036 | 10/1984 | Yamamoto et al. | 379/410 |
| 4,591,669 | 5/1986 | Duttweiler et al. | 370/291 |
| 4,805,215 | 2/1989 | Miller | 379/411 |
| 4,823,382 | 4/1989 | Martinez | 379/411 |
| 5,084,865 | 1/1992 | Koike | 370/289 |
| 5,371,789 | 12/1994 | Hirano | 379/410 |
| 5,473,686 | 12/1995 | Virdee | 379/410 |
| 5,533,120 | 7/1996 | Staudacher | 379/392 |
| 5,646,964 | 7/1997 | Ushirokawa et al. | 375/346 |
| 5,657,384 | 8/1997 | Staudacher et al. | 379/388 |
| 5,687,229 | 11/1997 | Sih | 379/410 |
| 5,703,903 | 12/1997 | Blanchard et al. | 375/232 |

FOREIGN PATENT DOCUMENTS

| | | |
|---|---|---|
| 0492647 | 7/1992 | European Pat. Off. . |
| 0578212 | 1/1994 | European Pat. Off. . |
| 0688099 | 12/1995 | European Pat. Off. . |
| 95 12919 | 5/1995 | WIPO . |

OTHER PUBLICATIONS

S. Ikeda et al., "A Fast Convergence Algorithm for Sparse–Tap Adaptive Fir Filters for Unknown Number of Multiple Echoes", 1994 IEEE, U.S.A., vol. 3, No. XP–002064578, pp. III–41/III–44.

Primary Examiner—Stephen Chin
Assistant Examiner—Michael W. Maddox
Attorney, Agent, or Firm—Sughrue, Mion, Zinn, Macpeak & Seas, PLLC

[57] ABSTRACT

An input signal is supplied to a tapped-delay line adaptive filter to produce tap signals which are equally divided into groups. The tap signals are selectively coupled on a per group basis through a switch to coefficient generators where tap-weight coefficients are produced. The selected tap signals are weighted respectively by the coefficients and summed together to produce a correction signal, which is combined with an output signal which is a replica of the input signal. The coefficients are updated with a residual error of the correction signal. Using the coefficients, the hopping order for selecting a tap group and the dwell time of the tap group are determined. Total power of the selected tap signals is monitored. When the monitored power is lower than a threshold value, the determination of the hopping order and dwell time is disabled, coefficient updating is disabled, and the residual error is nullified for fast convergence.

9 Claims, 3 Drawing Sheets

ADAPTIVE FILTER WITH DISABLING CIRCUIT FOR FAST TAP WEIGHT CONVERGENCE

BACKGROUND OF THE INVENTION

1. Field of the Invention

The present invention relates generally to adaptive filters for canceling undesired signal components. The invention is particularly suitable for canceling multiple echoes resulting from the trans-hybrid coupling of a hybrid circuit.

2. Description of the Related Art

Adaptive filters are used in many applications for canceling undesired signal components. Echo cancelers are a typical application of the adaptive filter for canceling an echo resulting from the trans-hybrid coupling of a hybrid circuit with an echo replica derived from the input signal of the adaptive filter. The adaptive filter has a tapped-delay line and a tap-weight coefficient controller for producing a sum of tap signals weighted respectively by tap-weight coefficients. According to a known convergence algorithm such as the LMS (least mean square) algorithm, the tap-weight coefficients are upated by correlations between the tap signals and a residual error of a correction signal which is represented by the sum of the weighted tap signals. Fast convergence of the tap-weight coefficients are of primary concern for designing an adaptive filter. A typical fast convergence technique is described in "A Fast Convergence Algorithm for Sparse-Tap Adaptive FIR Filters for Cancellation of Multiple Echoes", Shigeki Ikeda et al., Proceeding of the 1994 International Symposium on Noise and Clutter Rejection in Radars and Imaging Sensors, 1994. 11, pages 265 to 270. According to this algoritm, the tapped-delay line is equally divided into tap groups and taps are sequentially selected on a per group basis and the tap signals of the selected taps are weighted by respective coefficients. The selected taps are moved from one group to another according to a hopping order and the dwell time of the selected group is determined from the coefficients.

However, when the adaptive filter encounters a low power input such as low speech activity, the growth of the tap-weight coefficients is not sufficient to reach optimum levels even though the tap position is optimum for high speech activity. If the tap position control is continued with low input power, the selected taps would be shifted. Therefore, when the input level is recovered, it would take a long time to converge the tap weight coefficients.

SUMMARY OF THE INVENTION

It is therefore an object of the present invention to achieve fast convergence of tap-weight filter coefficients when recovering from a low input power condition.

According to a broader aspect of the present invention, there is provide an adaptive filter comprising a tapped-delay line for receiving an input signal and producing tap signals at successive taps of the delay line, and a tap-weight control circuit for producing a correction signal representative of correlations between the up signals and a residual error of the correction signal, combining the correction signal with an output signal which is a replica of the input signal to produce the residual error, and updating tap-weight coefficients with the residual error so that the residual echo reduces to a minimum, the correction signal being representative of a sum of the tap signals respectively weighted by the tap-weight coefficients. A power monitor circuit is provided for monitoring power of the input signal and nullifying the tap-weight coefficients when the monitored power is lower than a threshold value.

Preferably, the delay-line tape are respectively identified by tap indicators and equally divided into a plurality of tap groups. The tap-weight control circuit comprises a switch for sequentially selecting tap signals from active ones of the taps according to a tap position signal, a plurality of coefficent generators for producing a plurality of coefficients representative of correlations been the selected tap signals and a residual error, a plurality of multipliers for respectively weighting the selected tap signals with the coefficients and, an adder for producing a sum of the weighted tap signals, a subtractor for producing the residual error from the sum and an output signal of the adaptive filter, and tap-position and dwell-time control circuitry for determining, from the coefficients, an optimum number of active taps for each tap group, producing therefrom the tap position signal for each tap group in descending order of the number of active taps of each tap group, and determining an optimum dwell time of each tap position signal from the coefficients, each tap position signal being supplied to the switch for a monitor circuit detects the total power of tap signals at the active taps of the delay line, disables the tap-position and dwell-time control circuitry, and supplies a null signal to the coefficient generators instead of the residual error, when the detected total power is lower than a threshold value.

The tap-positon and dwell-time control circuitry comprises a minimum coefficient selector for selecting minimum values of the coeffcents and producing tap indicators corresponding to the selected minimum values, a queueing memory for storing the tap indicators from the selector in a queue, a group indicator memory for storing the group indicators and sequentially selecting one of the stored group indicators, a min/max detector for detecting maximum and minimum tap indicators from the selected group indicator for specifying a range between the maximum and minimum tap indicators, a comparator for comparing tap indicators from the queueing memory with the specified range and feeding each of the tap indicators back to the queueing memory if the tap indicator is outside of the specified range, so that inactive tap indicators are stored in the queueing memory location corresponding to inactive taps, means for determining active tap indicators from the inactive tap indicators of the queueing memory and controlling the switch according to the determined active tap indicators, and a controller for determining a hopping order according to the number of the active tap indicators of each of the groups, arranging the group indicators of the group indicator memory according to the hopping order, determining a plurality of dwell time data of the group indicators as a function of the hopping order, and allowing the coefficient generators to repeatedly update the coefficients according to the dwell time data of the selected group indicator of the group indicator memory, the controller being disabled by the power detection and disabling circuitry when the detected total power is lower than the threshold value.

According to a further aspect, the present invention provides a method for cancelling undesired signal components. The method comprises the steps of:

a) supplying an input signal to a tapped-delay line equally divided into a plurality of tap groups and producing tap signals therefrom;

b) selecting one of the tap groups;

c) producing tap-weight coefficients from tap signals from the selected taps and a residual echo;

d) respectively weighting the tap signals of the selected taps with the coefficients and producing a correction signal representative of a sum of the weighted tap signals;

e) producing the residual echo by combining the correction signal with an output signal and updating the coefficients with the residual echo;

f) monitoring total power of the tap signals from the selected tap group;

g) if the monitored total power is higher than the threshold value, determining, from the coefficients, a hopping order for sequentially selecting one of the tap groups and dwell time for the selected tap group, and then returning to step (b); and h) if the monitored total power is lower than a threshold value, introducing a delay and nullifying the residual error, and returning to step (f).

BRIEF DESCRIPTION OF THE DRAWINGS

The present invention will be describe in further detail with reference to the accompanying drawings, in which.

DETAILED DESCRIPTION

Figure 1:
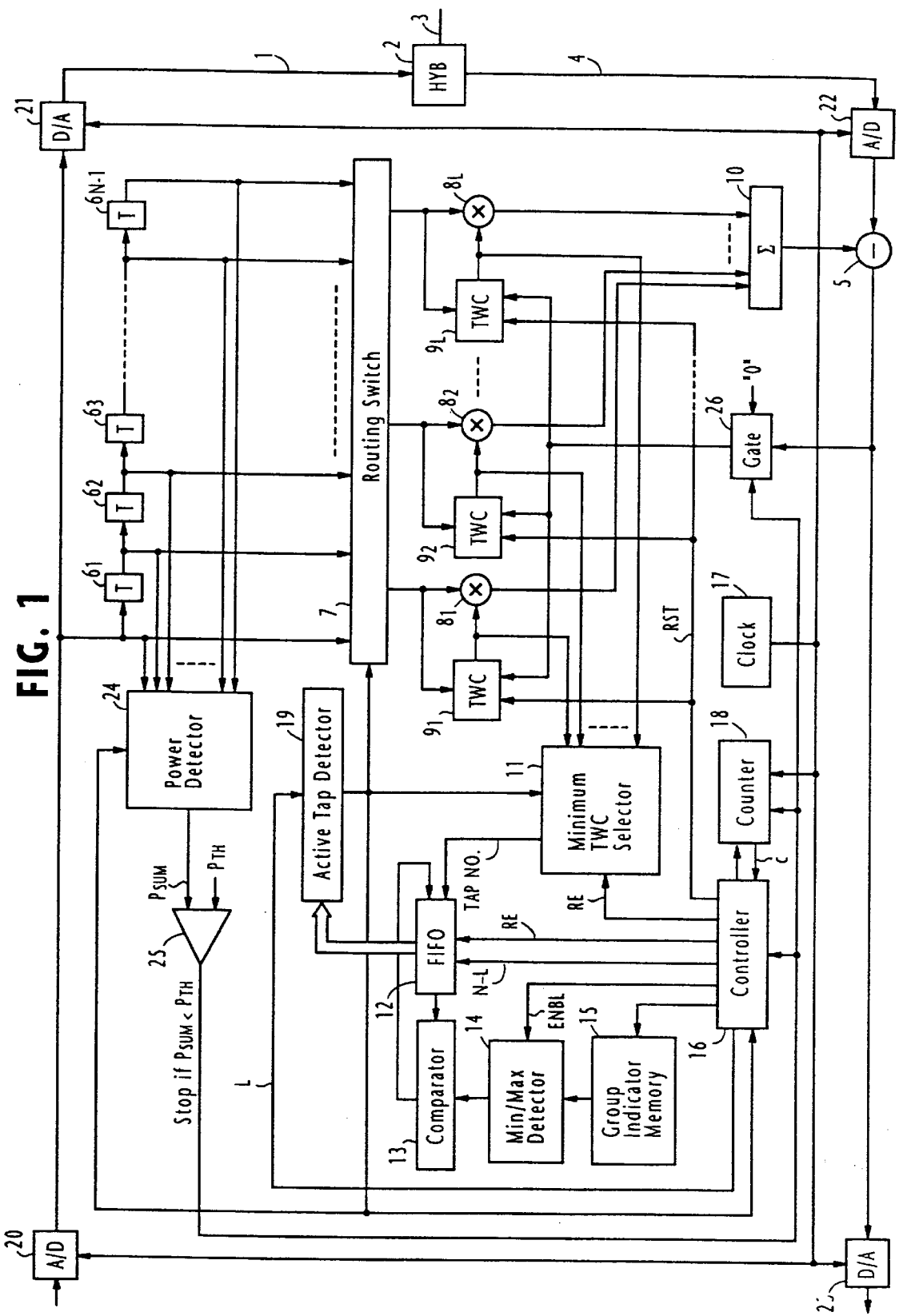
FIG. 1 is a block diagram of an echo canceller of the present invention.

For the purpose of disclosure, the adaptive filter of the present invention shown in FIG. 1 is implemented as in echo canceler. An input signal of the adaptive filter is supplied from a first talking party and applied to an A/D converter 20 where it is converted to digital form and fed via the receive circuit 1 of the four-wire section of a hybrid circuit 2 where it is coupled to the hybrid's two-wire circuit 3 for transmission to a second talking party. Analog signal from the two-wire circuit 3 is coupled to the transmit circuit 4 of the hybrid's four-wire section and converted to digital samples by an A/D converter 22 and supplied to a subtractor 5 whose output is converted to analog form by a D/A converter 23 for transmission to the talking party. Due to the inherent transhybrid coupling between the receive and transmit circuits of the hybrid's four-wire section, the analog signal from D/A converter 21 finds a leakage path to the input of A/D converter 22. The output signal of the A/D converter 22 is a replica of the input signal of the adaptive filter and returns to the first talking party as an echo. The echo canceller produces a correction signal from the input signal and supplies it as an echo replica to the subtractor 5 to cancel the echo. A/D converters 20, 22 and D/A converters 21, 23 are driven by clock pulses from a clock generator 17.

The echo canceller includes a tapped-delay line formed by a series of delay elements $6_1$ through $6_{N-1}$ driven by the clock generator 17 which is synchronized to the timing of the input sequence. The input of this tapped-delay line is connected to the receive channel 1 to produce a series of delayed tap signals on N delay-line taps at intervals T.

The taps of the delay line are connected to a tap selector, or routing switch 7 where they are selectively coupled to tap-weight multipliers $8_1$ through $8_L$ and corresponding tap weight coefficient generators $9_1$ through $9_L$ (where L is smaller than N). Those tap signals, which are selected by the routing switch 7, are respectively weighted by tap weight coefficients supplied from corresponding tap weight generators. The echo replica is a weighted sum of the tap weight coefficients, where the weighted sum is produced in an adder 10 by summing the outputs of the multipliers 8.

The tap-weight coefficient (TWC) generators 9 form part of an adaptive filter with the tapped delay line. The number of tap weight coefficients is such that it is sufficient to cover a dispersive impulse response. The number of delay-line taps is such that it allows multiple echoes to exist simultaneously across the delay line at a given instant of time.

The routing switch 7 selectively connects the delay-line taps to appropriate tap weight coefficient generators according to a routing configuration determined by an active tap detector 19.

Figure 2:
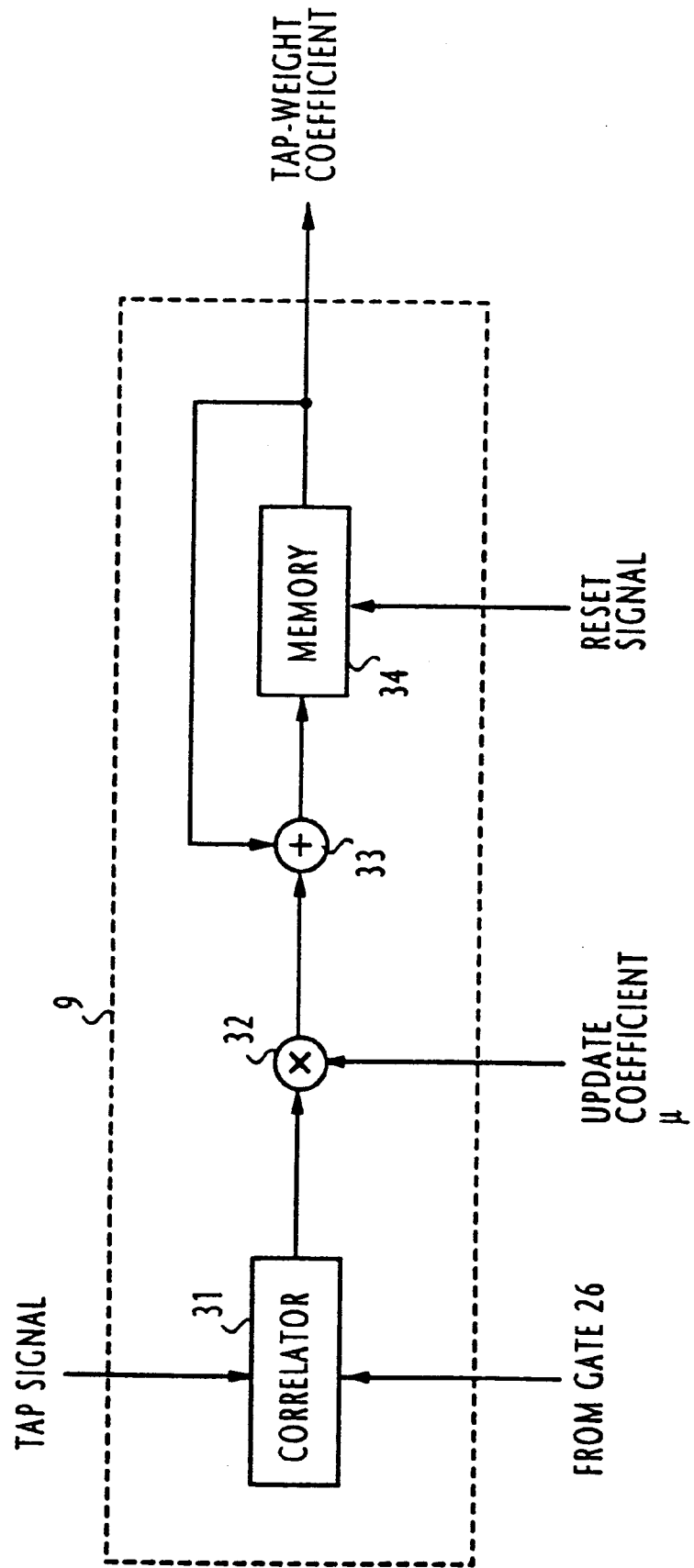
FIG. 2 is a block diagram of each tap weight coefficient generator of FIG. 1.

As illustrated in FIG. 2, each of the TWC generators includes a correlator 31 for detecting correlation between the corresponding tap signal and, via gate 26, either the error signal (i.e., residual echo) from subtractor 5 or a null (zero-value) signal. Normally, the error signal from subtractor 5 appears at the output of gate 26. Otherwise, the zero value appears at the output of gate 26. The output of correlator 31 is weighted by a predetermined update coefficient $\mu$ in a multiplier 32 and summed in an adder 33 with the output of a memory 34 so that the content of memory 34 is updated with the output of adder 33 and represents an accumulated value of the $\mu$-scaled correlation signal and is cleared in response to a reset signal from a controller 16. In this way, all the tap weight coefficients are updated at clock intervals according to the normalized least mean square (NLMS) algorithm so that the error signal is reduced to a minimum. As will be understood, the reset interval is determined for each tap group by the dwell time of the tap group.

The outputs of the TWC generators 9 are further connected to a minimum coefficient selector 11 where a predetermined number of minimum coefficient values are selected and their corresponding tap indicators are determined using the output of active tap detector 19 which is initially supplied with L tap indicators as the identifiers of tentative active taps.

In response to a read enable command from controller 16, the tap indicators of the selected minimum tap weight coefficients are supplied from the minimum coefficient selector 11 to a first-in-first-out memory 12. This FIFO memory is initially loaded with N–L tap indicators from controller 16 as the identifiers of delay-line taps tentatively used during initialization period, and a tap indicator is read out of FIFO memory 12 in response to a red enable command from controller 16 into a comparator 13 where it is compared with a range of values specified by the output a min/max detector 14. If the tap indicator from FIFO memory 12 does not fall within the specified range, comparator 13 returns it to FIFO memory 12 to put it in queue again. This read-and-compare process is repeated a number of times corresponding to the number of minimum tap weight coefficients selected by the minimum coefficient selector 11.

Since N>L, there are L delay-line taps which contribute to the generation of an echo replica and (N–L) delay-line taps which do not contribute. In the specification, the contributing taps are termed "active taps" and non-contributing taps are termed "inactive taps". During the initialization period of the adaptive filter, L tap weight coefficients are assigned to those delay-line taps which are equally spaced. Thus, in the initial state, the assigned taps are used tentatively as active taps.

According to the present invention, the N delay-line taps are equally divided into M groups G(i), where i=1, 2, . . . , M. If the adaptive filter has thirty delay-line taps represented by tap indicators 0, 1, . . . , 29, and M=5, these taps may be equally divided into the following five groups:

G(1)={0, 1, 2, 3, 4, 5}

G(2)={6, 7, 8, 9, 10, 11}

G(3)={12, 13, 14, 15, 16, 17}
G(4)={18, 19, 20, 21, 22, 23}
G(5)={24, 25, 26, 27, 28, 29}

Group indicators G(1) to G(5) are stored in a group indicator memory 15. Under the control of controller 16, tap group indicators Z(j) are initially stored in memory 15 in ascending order of their values as follows (where j=1, 2, . . . 5):

Z(1)=G(1)
Z(2)=G(2)
Z(3)=G(3)
Z(4)=G(4)
Z(5)=G(5)

The address pointer "j" of the group indicator memory 15 is set to the starting point of the sequence to produce an output signal Z(1)={1, 2, 3, 4, 5}. The min/max detector 14 is connected to receive one of the group indicators which is selected by the address pointer and determines the maximum and minimum tap indicators $K_{max}$ and $K_{min}$ of the selected group. Comparator 13 uses these values to specify the range for comparison with the tap indicator supplied from FIFO memory 12.

During operation that follows an initialization process, FIFO memory 12 will be filled with inactive tap indicators and the active tap detector 19 examines these inactive tap indicators and recognizes the remainder as active tap indicators from which it determines the configuration of the routing switch 7. A clock counter 18 is connected to the clock generator 17 to start incrementing a clock count "c" when enabled by controller 16 and supplies the incremented value to the controller.

In order to interrupt the operation of the echo canceller when speech activity is very low or noise is dominant, a power detector 24 is connected to all the taps of the delay line. Power detector 24 responds to the group indicator currently selected in memory 15 determines a total sum $P_{SUM}$ of the power of tap signals of the selected group. The output of power detector 24 is compared in a power comparator 25 with a threshold value $P_{TH}$. If the total power $P_{SUM}$ is lower than the threshold value, comparator 25 supplies a stop signal to controller 16 and gate 26. During the presence of the stop signal, controller 16 interrupts its operation and gate 26 applies a null (zero-value) signal to the correlator of all the coefficient generators 9. As a result, all the coefficient generators 9 interrupt their coefficient update operations. The stop signal is further supplied to the clock counter 18 to prevent it from incrementing the clock count so that tap position control which will be described later is interrupted.

Figure 3:
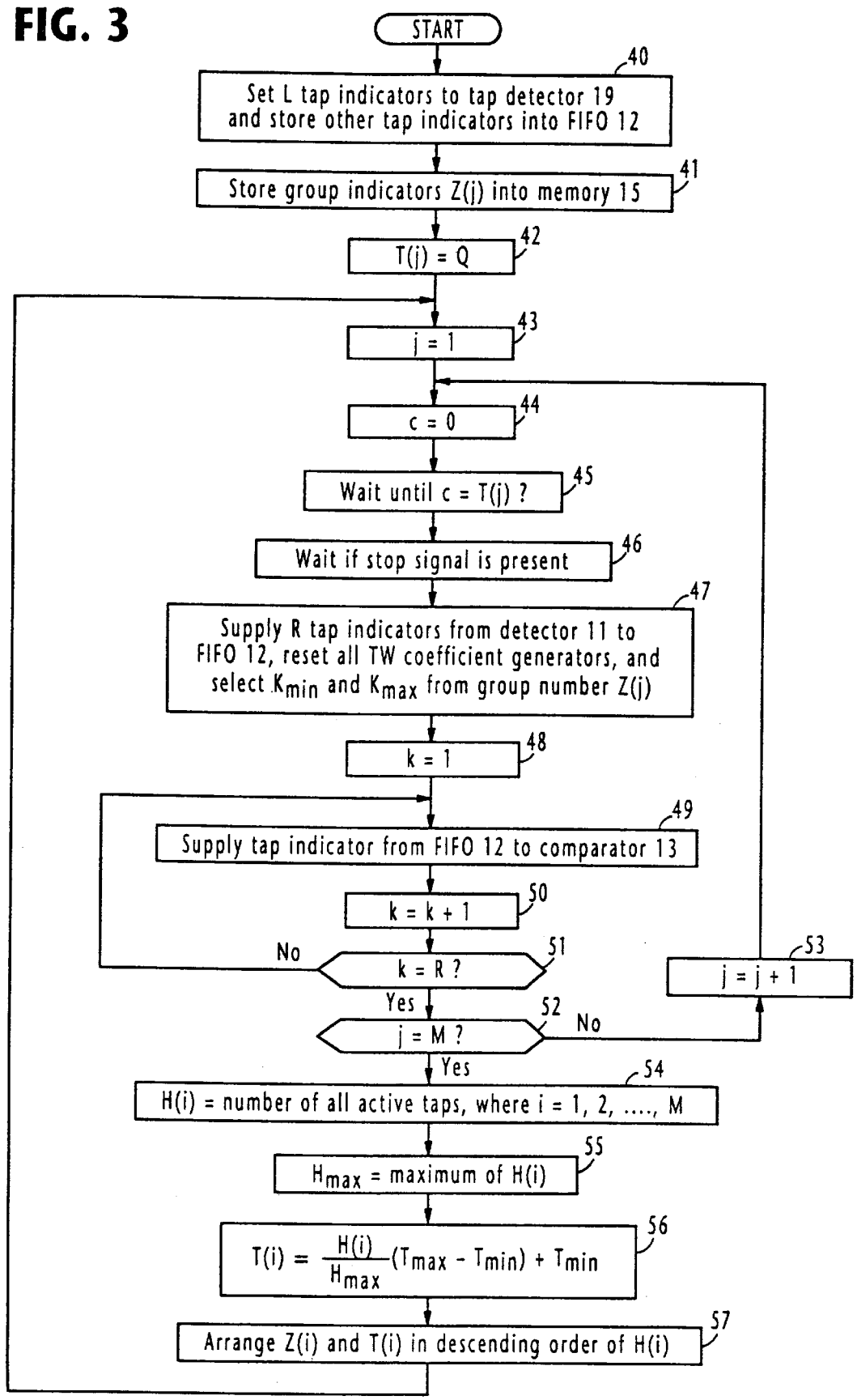
FIG. 3 is a flowchart of the operation of the controller of FIG. 1.

The controller 16 operates according to the flowchart of FIG. 3. Controller 16 begins operation, at step 40, by selecting first L tap indicators from N tap indicators which are arranged in ascending order and setting the selected tap indicators to the active tap detector 18 and setting the other tap indicators into FIFO memory 12. At step 41, group indicators Z(j) are stored into group indicator memory 15 in ascending order of their values, where j=1, 2, . . . , M. A dwell time variable T(j) is set to a constant value Q at step 42 and the address pointer "j" of group indicator memory 15 is set equal to 1 (step 43) so that group indicator Z(1) is initially selected in memory 15. At step 44, the controller resets the clock counter 18 to 0 to start incrementing its clock count "c". At step 45, controller 16 waits until the count "c" becomes equal to the dwell time T(j) which is initially set to the predetermined value Q.

The time between c=0 and c=T(j) is the dwell during which the routing switch 7 stays in the same routing configuration and all the tap weight coefficient generators 9 are updated with new tap signals and T(j) sets of tap weight coefficients are supplied to the minimum TWC selector 11 as well to adder 10 and error signals are supplied from subtractor 5 and fed back to the tap weight coefficient generators 9. Initially, the number of active taps for each tap group is equal to the integer L and the dwell time T(j) is set equal to the constant value Q. However, as the subsequent feedback operation proceeds an optimum number of active taps and an optimum dwell time T(j) are determined for each tap group, and in optimum sequential order of group indicators in the group indicator memory 15 is determined.

Minimum selector 11 selects R minimum tap weight coefficients from the (T(j)×L) tap weight coefficients and determines R tap indicators that establish the identity of the selected minimum tap weight coefficients using the active tap indicators supplied from the active tap detector 19.

When the clock count "c" becomes equal to T(j) at step 45, controller 16 proceeds to step 46 to check for the presence of a stop signal from the power comparator 25. If the stop signal is present, controller 16 stops its operation.

If no stop signal is present, controller 16 proceeds to step 47 to supply a read enable signal to the minimum coefficient selector 11 to cause the minimum coefficient selector to supply the selected R tap indicators to FIFO memory 12, reset all coefficient generators 9, and enable the min/max detector 14 to select minimum and maximum tap indicators $K_{min}$ and $K_{max}$ from the currently selected tap group indicator Z(j).

Controller 16 then proceeds to step 48 where it resets the clock counter 17 to 0 and sets a variable "k" to 1. At step 49, controller 16 enables FIFO 12 to supply a tap indicator to comparator 13, causing it to check to see if the tap indicator falls within the range between $K_{min}$ and $K_{max}$. If not, the tap indicator is fed back to FIFO memory 12 and placed in queue again. The controller proceeds to step 50 and increments the variable "k" by 1. If variable "k" is not equal to R (step 51), controller flow returns to step 49, causing the comparator 13 to repeat the checking operation on the next tap indicator from FIFO memory 12. With the repeated feedback process, the contents of FIFO memory 12 are updated and the active tap detector 19 updates its active tap indicators and reconfigures the input-output connections of routing switch 7.

If k=R, the controller flow exits from the loop to step 52 to check to see if the variable "j" is equal to M, the number of tap groups. If "j" is not equal to M, flow proceeds from step 52 to step 53 to increment the address pointer "j" by 1 so that the next group of tap indicators is selected in the group indicator memory 15. The controller then exits step 53 and goes again to step 44 to repeat the above process on tap signals of the next tap group.

After all the tap groups are tested in this way, the variable "j" becomes equal to M and controller 16 proceeds from step 52 to sep 54 where the controller receives the output of active tap detector 19 and determines the number of all active taps H(i), where i=1, 2, . . . , M. At step 55 controller 16 determines the maximum $H_{max}$ of the numbers of active taps H(1) through H(M).

At step 56, the controller determines the dwell time T(i) of each group by performing the following calculation:

$$T(i) = \frac{H(i)}{H_{max}}(T_{max} - T_{min}) + T_{min}$$

where i=1, 2, . . . , M, $T_{max}$ represents the dwell time of the group having the maximum number ($H_{max}$) of active taps, and $T_{min}$ represents the dwell time of the group having no active taps. In a practical aspect of the present invention, predetermined constant values are used for $T_{max}$ and $T_{min}$. The dwell times T(1), T(2), ..., T(M) are thus determined for the respective tap groups Z(1), Z(2), ..., Z(M).

At step 57, the "hopping order" is determined by arranging the group indicators Z(i) stored in group indicator memory 15 and the dwell time data T(i) according to the descending order of the value H(i), i.e., the hopping order. Following the execution of step 57, flow returns to step 43 to reset the address pointer "j" to 1, restarting the above process from the first of the group indicators which are now rearranged in memory 15 according to the hopping order H(i) and, where the coefficients tap weight are updated a number of times for each tap group according to the dwell time data of the tap group.

During the initialization period, tap weight coefficient updates are repeated M times using the dwell time T(j)=Q according to the tentatively arranged group indicators. Following this initialization period, the hopping order of the selected taps and their dwell times are obtained by steps 55 to 57 and the dwell time uniquely assigned to each group Z(i) is used at step 45.

After the hopping order and dwell times have been determined in this way, controller 16 now returns to step 43 to reset the address pointer "j" to 1 and repeat the tap weight coefficient updates using the group indicators in memory 15, which are now selected according to the hopping order determined by the number of active taps, and using the dwell time T(i) determined uniquely for the selected group.

Where the tip indicators are determined by the active tap detector [{0}, {6, 7, 8, 9}, {15, 16}, {19, 20, 21}], then the number of active taps H(i) of each group is given by:

H(1)=1

H(2)=4

H(3)=2

H(4)=3

H(5)=0

If $T_{max}$ and $T_{min}$ in are respectively equal to integers "110" and "10", the dwell times T(i) are given in term of the number of clock pulses as follows:

T(1)=(1/4)×100+10=35

T(2)=(4/4)×100+10=110

T(3)=(2/4)×100+10=60

T(4)=(3/4)×100+10=85

T(5)=(0/4)×100+10=10

Therefore, the group indicators Z(i) stored in the group indicator memory 15 and the dwell time data T(i) are arranged in descending order of H(i) a follows:

Z(1)=T(2)=G(2)

Z(2)=T(4)=G(4)

Z(3)=T(3)=G(3)

Z(4)=T(1)=G(1)

Z(5)=T(5)=G(5)

Since the control range of tap positions allows hopping across all the taps of the delay line from instant to instant, the echo canceller of this invention is capable of adaptively cancelling multiple echoes that extend across the delay line. In addition, since the dwell time of each group varies as a function of the number of its active taps, coefficient updates are also provided satisfactorily for respective these echoes.

When the stop signal is produced by the power comparator 25, both dwell time control and tap position (hopping) control are disabled. Therefore, if voice activity is low and sufficient power is not obtained when a given group is selected, the number of tap weight coefficient updates (i.e., the dwell time of the given group) to be performed on that group is held as long as the stop signal is present. In the hold interval, the clock counter 18 remains at the clock count which it attained at the beginning of the hold interval. Thus, at the end of the hold interval, coefficient update is resumed with the count value which the clock counter attained at the beginning of the hold interval. High-speed convergence is then achieved when the level of speech activity is restored to normal.

What is claimed is:

1. An adaptive filter comprising:

a tapped-delay line for receiving an input signal and producing tap signals at successive taps of the tapped-delay line;

a tap-weight control circuit for producing a correction signal, representing correlations between the tap signals, weighted by tap-weight coefficients, and a residual error of the correction signal, by combining the correction signal with an output signal which is a replica of the input signal to produce the residual error, and updating the tap-weight coefficients with the residual error so that a residual echo reduces to a minimum, wherein the correction signal represents a sum of the tap signals respectively weighted by the tap-weight coefficients; and a power monitor circuit for monitoring power of said input signal and interrupting the updating of the tap-weight coefficients when the monitored power is lower than a threshold value.

2. An adaptive filter as claimed in claim 1, wherein said tapped-delay line is equally divided into a plurality of tap groups, and wherein said tap-weight control circuit comprises:

a tap selector for selecting one of said tap groups according to a control signal representative of a hopping order and a dwell time;

a plurality of tap-weight coefficient generators for producing tap-weight coefficients from tap signals from the selected tap group and a residual error of a correction signal;

a circuit for respectively weighting the tap signals from the selected group with said tap-weight coefficients and for producing a sum of the weighted tap signals, where the sum represents said correction signal;

a combiner for producing said residual error by combining the correction signal with said output signal and updating said tap-weight coefficient generators with said residual error; and means for determining, from said tap weight coefficients, said hopping order of said control signal for sequentially selecting each one of the tap groups and for determining said dwell time of the control signal; and wherein said power monitor circuit monitors total power of the tap signals from the selected taps, and disables said determination means and nulls the residual error when the monitored total power is lower than a threshold value.

3. An adaptive filter as claimed in claim 1, wherein said taps are respectively identified by tap indicators and equally divided into a plurality of tap groups, and wherein said tap-weight control circuit comprises:

a switch for sequentially selecting tap signals from active ones of said taps according to a tap position signal;

a plurality of tap-weight coefficient generators for producing a plurality of tap-weight coefficients representative of correlations between the selected tap signals and said residual error;

a plurality of multipliers for respectively weighting the selected tap signals with said tap-weight coefficients and an adder for producing a sum of the selected and weighted tap signals;

a subtractor for producing said residual error from said sum and said output signal; and tap-position and dwell-time control circuitry for determining, from said tap-weight coefficients, an optimum number of active taps for each tap group, producing therefrom said tap position signal for each tap group in descending order of the number of active taps of each tap group, and determining an optimum dwell time of each tap position signal from said tap-weight coefficients, each tap position signal being supplied to said switch for a duration determined by the corresponding dwell time, said power monitor circuit detecting total power of tap signals at the active taps of the delay line and disabling said tap-position and dwell-time control circuitry and supplying a null signal to said tap-weight coefficient generators, instead of said residual error, when the detected total power is lower than a threshold value.

4. An adaptive filter as claimed in claim 3, wherein said tap groups are identified by group identifiers, and wherein said tap-position and dwell-time control circuitry comprises:

a minimum coefficient selector for selecting minimum values of said tap-weight coefficients and producing tap indicators corresponding to the selected minimum values;

a queueing memory for storing the tap indicators from said selector in a queue;

a group indicator memory for storing said group indicators and sequentially selecting one of the stored group indicators;

a min/max detector for detecting maximum and minimum tap indicators from the selected group indicator for specifying a range between the maximum and minimum tap indicators;

a comparator for comparing tap indicators from said queueing memory with the specified range and then feeding each of the tap indicators back to said queueing memory if the tap indicator is outside of the specified range, so that inactive tap indicators are stored in said queueing memory as inactive ones of said taps;

means for determining active tap indicators from the inactive tap indicators of said queueing memory and for controlling said switch according to the determined active tap indicators; and a controller for determining a hopping order according to the number of said active tap indicators of each of said groups, arranging the group indicators of said group indicator memory according to the hopping order, determining a plurality of dwell time data of said group indicators as a function of the hopping order, and allowing said coefficient generators to repeatedly update the coefficients according to the dwell time data of the selected group indicator of said group indicator memory, said controller being disabled by said power detection and disabling circuitry when the detected total power is lower than said threshold value.

5. An adaptive filter as claimed in claim 3, wherein each of said tap-weight coefficient generators comprises:

a correlator for producing a correlation signal representing correlation between one of the tap signals selected by said switch and said residual error;

a multiplier for scaling the correlation signal with an update coefficient; and an accumulator for accumulating the scaled correlation signal for an interval corresponding to the dwell time of each tap group in order to produce one of said update coefficients.

6. An adaptive filter as claimed in any of claims 1 to 5, further comprising a hybrid circuit having a two-wire section and a four-wire section, wherein said input signal is supplied to a receive circuit of the four-wire section and said output signal is supplied from a transmit circuit of the four-wire section.

7. A method for canceling undesired signal components, comprising the steps of:

a) supplying an input signal to a tapped-delay line equally divided into a plurality of tap groups and producing therefrom tap signals;

b) selecting one of the tap groups;

c) producing tap-weight coefficients from tap signals from the selected taps and a residual echo;

d) respectively weighting the tap signals of the selected taps with said tap-weight coefficients and producing a correction signal representing a sum of the weighted tap signals;

e) producing said residual echo by combining the correction signal with an output signal which is a replica of said input signal, and updating said tap-weight coefficients with said residual echo;

f) monitoring total power of the tap signals from the selected tap group;

g) if the monitored total power is higher than said threshold value, determining, from said tap-weight coefficients, a hopping order, for sequentially selecting said one of the tap groups, determining a dwell time for the selected tap group, and returning to step (b); and h) if the monitored total power is lower than a threshold value, introducing a delay, nullifying the residual error, and returning to step (f).

8. A method as claimed in claim 7, wherein said input signal is supplied to a receive circuit of a four-wire section of a hybrid circuit and said output signal is supplied from a transmit circuit of a four-wire section of the hybrid circuit.

9. A method as claimed in claim 7 or 8, further comprising the step of storing tap group indicators in a tap group indicator memory and sequentially selecting one of the stored tap group indicators, and wherein the step (g) comprises the steps of:

storing tap indicators in a memory having a queue;

detecting maximum and minimum tap indicators from the selected tap group indicator for specifying a range between the maximum and minimum tap indicators;

repeatedly comparing a tap indicator from said queue with the specified range and feeding the tap indicator back to said queue if the tap indicator is outside of the specified range so that inactive tap indicators are stored in said queue as inactive ones of said taps;

determining active tap indicators from the inactive tap indicators of said queue and controlling a tap selector switch according to the active tap indicators;

determining a hopping order according to the number of said active tap indicators of each of the tap groups, arranging the tap group indicators of said tap group indicator memory according to the hopping order, and determining a plurality of dwell time data of said tap group indicators as a function of the hopping order; and returning to step (b) so that the tap weight coefficients are updated a number of times determined by the dwell time data of the selected tap group indicator.

* * * * *